(12) United States Patent
Tseng et al.

(10) Patent No.: US 12,510,563 B2
(45) Date of Patent: *Dec. 30, 2025

(54) POGO PIN COOLING SYSTEM AND ELECTRONIC DEVICE TESTING APPARATUS HAVING THE SYSTEM

(71) Applicant: CHROMA ATE INC., Taoyuan (TW)

(72) Inventors: I-Shih Tseng, Taoyuan (TW); I-Ching Tsai, Taoyuan (TW); Xin-Yi Wu, Taoyuan (TW); Chin-Yi Ouyang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 259 days.

This patent is subject to a terminal disclaimer.

(21) Appl. No.: 18/307,866

(22) Filed: Apr. 27, 2023

(65) Prior Publication Data

US 2024/0151746 A1 May 9, 2024

Related U.S. Application Data

(63) Continuation-in-part of application No. 18/050,500, filed on Oct. 28, 2022, now Pat. No. 12,253,541.

(51) Int. Cl.
| | |
|---|---|
| *G01R 1/44* | (2006.01) |
| *G01R 1/04* | (2006.01) |
| *G01R 1/067* | (2006.01) |
| *H01R 13/24* | (2006.01) |
| *H05K 7/20* | (2006.01) |

(52) U.S. Cl.
CPC ............ *G01R 1/44* (2013.01); *G01R 1/0458* (2013.01); *G01R 1/06722* (2013.01); *H01R 13/2421* (2013.01); *H05K 7/202* (2013.01); *H05K 7/20272* (2013.01); *H01R 2201/20* (2013.01)

(58) Field of Classification Search
CPC .......................... G01R 1/0466; G01R 31/2877
See application file for complete search history.

(56) References Cited

U.S. PATENT DOCUMENTS

| | | | |
|---|---|---|---|
| 5,113,622 A * | 5/1992 | Nishiguchi | B24B 37/04 451/7 |
| 6,027,605 A * | 2/2000 | Lehmann | B23Q 17/002 118/712 |
| 12,253,541 B2 * | 3/2025 | Tseng | G01R 1/06722 |

(Continued)

FOREIGN PATENT DOCUMENTS

WO     WO-2023236182 A1 * 12/2023     ........... G01R 1/0466

*Primary Examiner* — Paresh Patel
(74) *Attorney, Agent, or Firm* — McClure, Qualey & Rodack, LLP

(57) ABSTRACT

The present invention relates to a pogo pin cooling system and a pogo pin cooling method and an electronic device testing apparatus having the system. The system uses a cooling fluid supply module for the cooling of the pogo pin, and the cooling fluid may be either a coolant or a cooling gas. When an electronic device is accommodated in the chip socket, the cooling fluid supply module supplies a cooling fluid into the chip socket through the cooling fluid supply channel and the inlet, and the cooling fluid passes through the pogo pins and then flows into the cooling fluid discharge channel through the outlet. In the present invention, the cooling fluid is mainly used to cool not only the pogo pins in the chip socket but also the bottom surface of the electronic device and the solder ball contacts on the bottom surface.

1 Claim, 7 Drawing Sheets

(56) References Cited

U.S. PATENT DOCUMENTS

| | | | |
|---|---|---|---|
| 2002/0197895 A1* | 12/2002 | Eldridge | G01R 31/2887 439/259 |
| 2003/0122567 A1* | 7/2003 | Miller | G01R 31/2875 324/750.08 |
| 2005/0067146 A1* | 3/2005 | Thayer | G01R 31/2886 165/80.3 |
| 2005/0225346 A1* | 10/2005 | Saito | G01R 31/2877 324/757.01 |
| 2006/0145715 A1* | 7/2006 | Salmon | G01R 31/2886 324/750.08 |
| 2006/0255815 A1* | 11/2006 | Hirata | G01R 1/06733 324/755.01 |
| 2008/0150567 A1* | 6/2008 | Lou | G01R 1/44 324/750.08 |
| 2008/0257537 A1* | 10/2008 | Hatta | G05D 23/1919 165/104.32 |
| 2010/0182013 A1* | 7/2010 | Lou | G01R 31/2874 324/555 |
| 2012/0194213 A1* | 8/2012 | Komatsu | G01R 31/2887 324/756.03 |
| 2016/0116217 A1* | 4/2016 | Law | H01L 24/75 239/69 |
| 2024/0030102 A1* | 1/2024 | Ohira | H01L 23/473 |
| 2024/0142492 A1* | 5/2024 | Tseng | G01R 1/06722 |

* cited by examiner

POGO PIN COOLING SYSTEM AND ELECTRONIC DEVICE TESTING APPARATUS HAVING THE SYSTEM

CROSS-REFERENCE TO RELATED APPLICATIONS

This application is a continuation-in-part of U.S. patent application Ser. No. 18/050,500, filed Oct. 28, 2022, now U.S. Pat. No. 12,253,541. The above-referenced application is hereby incorporated herein by reference in their entirety.

FIELD OF THE INVENTION

The present invention relates to a system and method suitable for cooling a plurality of pogo pins of a testing apparatus during execution of a test of an electronic device, and an electronic device testing apparatus having the system.

DESCRIPTION OF THE PRIOR ART

In order to ensure quality of electronic devices, the electronic devices must be tested prior to factory shipment. In the case of testing a chip, the chip is first placed into a test socket in which a plurality of pogo pins are provided in the bottom, and the test is initiated after the solder balls on the lower surface of the chip are electrically contacted with the plurality of pogo pins.

However, as the latest chip layout design has more functions and more complex processing or computing operations, the chip has more contacts on its lower surface, and the number of pogo pins in the test socket has to be increased accordingly. With the advancement of the semiconductor manufacturing process, the volume of the chip is getting smaller, and the density of the pogo pins in the test socket is also getting higher. Due to the increasingly complex functions, time necessary for execution of the test is getting longer, and power applied to the chip is getting higher. Accordingly, great heat generated when the chip is tested is directly conducted to the solder balls of the chip and the pogo pins.

Generally, the melting point of the solder balls is 180° C., but the solder balls begin to be softened gradually when the solder balls are heated to 120° C. On the other hand, when power applied to the chip by the testing apparatus upon execution of the test reaches 900 W to 1000 W, the solder balls would be heated to 120° C. However, power applied to the chip having complex functions by the testing apparatus often reaches 800 W to 2600 W. Therefore, during execution of the test, the solder balls are often melted and stuck to the pogo pins, or solder scraps remain in the test socket. After a period of time, it may lead to failure of the test, and it may lead to short circuits at worst, resulting in damage of the chip or failure of the testing apparatus.

SUMMARY OF THE INVENTION

The main object of the present invention is to provide a pogo pin cooling system, a pogo pin cooling method and an electronic device testing apparatus having the system, capable of cooling a plurality of pogo pins in a test socket and a plurality of solder ball contacts of an electronic device and of preventing solder balls from being melted.

To achieve the above object, the present invention provides a pogo pin cooling system, which is used for cooling a plurality of pogo pins in a chip socket, the chip socket comprising at least one inlet and at least one outlet. The system mainly comprises at least one cooling fluid supply channel, at least one cooling fluid discharge channel and a cooling fluid supply module, wherein the cooling fluid supply channel is communicated with the inlet, and the cooling fluid discharge channel is communicated with the outlet, and wherein when an electronic device is accommodated in the chip socket, the cooling fluid supply module supplies the cooling fluid into the chip socket through the cooling fluid supply channel and the inlet, and the cooling fluid passes through the pogo pins and then flows into the cooling fluid discharge channel through the outlet.

In other words, the present invention mainly uses either a coolant or a cooling gas as the cooling fluid to cool not only the pogo pins in the chip socket but also the lower surface of the electronic device and the solder ball contacts on the lower surface. In this way, the pogo pins and the solder balls at a high temperature can be cooled during execution of the test so as to prevent the solder balls from being softened or even melted due to the high temperature and hence prevent the pogo pins and the chip socket from being contaminated. Also, the electronic device can be cooled and maintained at the test temperature.

The system of the present invention may further comprise a purge gas supply module, which is communicated with the inlet of the chip socket. When the cooling fluid supply module stops supplying the cooling fluid, the purge gas supply module supplies a purge gas into the chip socket through the inlet to urge the cooling fluid to the at least one cooling fluid discharge channel. In other words, when the test is completed and the supply of the cooling fluid to the chip socket is stopped, the present invention uses the purge gas supply module to remove the cooling fluid remaining in the chip socket or on the electronic device so as to keep the electronic device and the chip socket clean and dry and to recycle the residual cooling fluid for reuse.

To achieve the above object, the present invention provides an electronic device testing apparatus comprising the above mentioned pogo pin cooling system, a pressing head, a test socket and a main controller, wherein the main controller is electrically connected to the pressing head, the test socket and the cooling fluid supply module; wherein the chip socket is formed on an upper surface of the test socket, the pressing head is arranged above the test socket and is controlled by the main controller to be selectively moved toward or away from the test socket; when the electronic device is accommodated in the chip socket, the controller controls the pressing head to press the electronic device and controls the cooling fluid supply module to supply the cooling fluid into the chip socket. Accordingly, the present invention can achieve fully automatic operation by means of the main controller and significantly improve test efficiency.

To achieve the above object, the present invention provides a pogo pin cooling method, comprising the steps of: placing an electronic device into a chip socket, a bottom surface of the chip socket including at least one pogo pin; supplying a cooling fluid into the chip socket through at least one cooling fluid supply channel so that the cooling fluid passes through the at least one pogo pin and is discharged from the chip socket through the at least one cooling fluid discharge channel; and stopping supplying the cooling fluid into the chip socket.

Therefore, the pogo pin cooling method provided by the present invention cools the pogo pins in the chip socket and the solder balls of the electronic device by using a coolant or a cooling gas as the cooling fluid. Furthermore, a closed cooling space formed by placing the electronic device into the chip socket, the cooling fluid supply channel and the cooling fluid discharge channel form a closed loop cooperatively so that the cooling fluid is circulated continuously to improve the cooling effect.

Moreover, in the present invention, after the supply of the cooling fluid is stopped, a purge gas can be supplied into the chip socket by means of a purge gas supply module to urge the cooling fluid to the cooling fluid discharge channel. That is to say, a high pressure gas can be supplied by means of the purge gas supply module to force the cooling fluid remaining in the cooling space into the cooling fluid discharge channel and to effectively prevent the cooling fluid from contaminating the electronic device and the chip socket.

BRIEF DESCRIPTION OF DRAWINGS

No Color Drawings

DETAILED DESCRIPTION OF THE INVENTION

Figure 1:
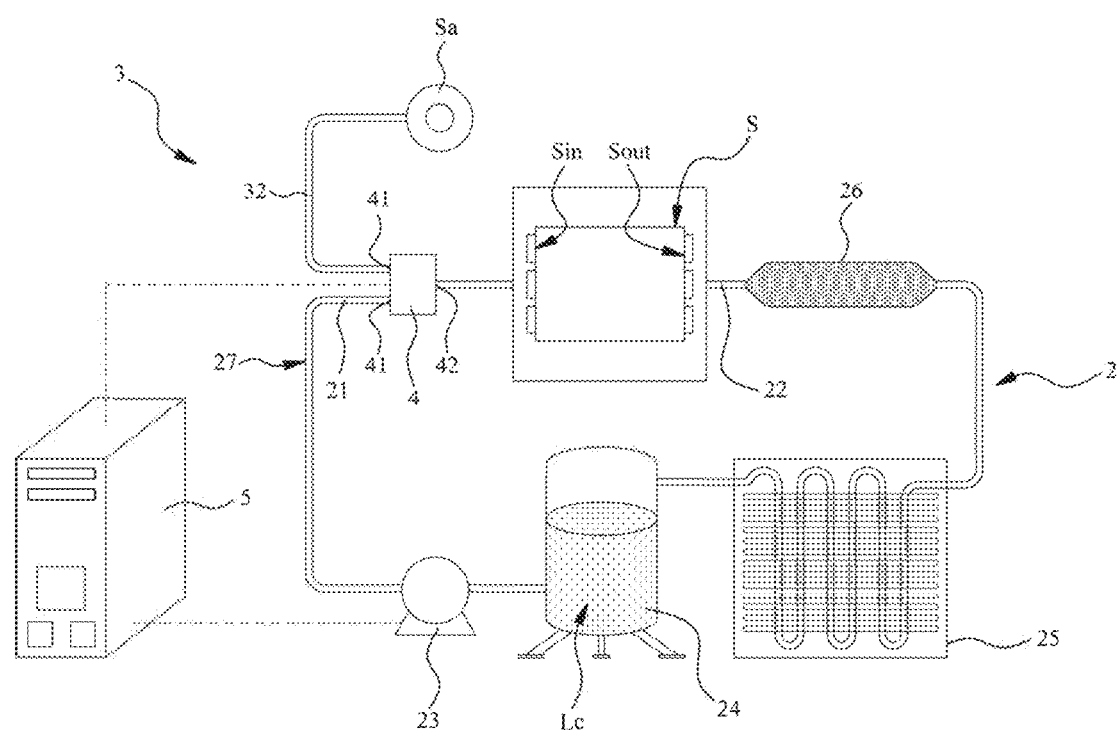
FIG. 1 is a schematic diagram of a pogo pin cooling system of the present invention employing a liquid cooling method.

Before a pogo pin cooling system, a pogo pin cooling method, and an electronic device testing apparatus having the system according to the present invention are described in detail in the embodiments, it should be noted that in the following description, similar components will be designated by the same reference numerals. Furthermore, the drawings of the present invention are for illustrative purposes only, they are not necessarily drawn to scale, and not all details are necessarily shown in the drawings. The testing apparatus to which the present invention is applied includes, but is not limited to, a semiconductor chip testing apparatus, a system-level automatic testing apparatus and the like.

Reference is made to FIG. 1, which is a schematic diagram of the pogo pin cooling system of the present invention employing a liquid cooling method. As shown in the figure, the pogo pin cooling system of the present embodiment is mainly used to cool a plurality of pogo pins Sp in a chip socket S of a test socket and a plurality of solder ball contacts of an electronic component C (see FIG. 2A), wherein the chip socket S includes a plurality of inlets Sin and a plurality of outlets Sout. The pogo pin cooling system of this embodiment mainly includes a cooling fluid supply module 2, a cooling fluid supply channel 21, a cooling fluid discharge channel 22, a purge gas supply module 3, a switch module 4 and a main controller 5. The cooling fluid supply module 2 further includes a coolant Lc, a pump 23, a coolant tank 24, a radiator 25, a filter 26 and a cooling fluid pipe line 27.

Furthermore, as shown in the figure, the cooling fluid supply channel 21 and the cooling fluid discharge channel 22 are respectively disposed at two ends of the cooling fluid pipe line 27. The filter 26, the radiator 25, the coolant tank 24, the pump 23 and the cooling fluid supply channel 21 are provided on the cooling fluid pipe line 27 in sequence from the cooling fluid discharge channel 22 in the circulation direction. The filter 26 is used to filter out foreign matters such as solder scraps and dust in the coolant Lc, and the radiator 25 is used to dissipate heat from the coolant Lc. For example, the coolant Lc can be cooled through a meandering pipe line and a plurality of heat dissipation fins. A fan for generating forced convection may be used to improve the heat dissipation effect.

In addition, the coolant tank 24 is used to store the coolant Lc for circulation, and the pump 23 is used to pump the coolant Lc so that the coolant Lc is forcibly circulated. The switch module 4 may be an electromagnetic control valve, which includes two inlet ends 41 and one outlet end 42. The purge gas supply module 3 of this embodiment includes a gas pressure source channel 32, one end of which is communicated with a gas pressure source Sa, and the other end of which is communicated with one of the two inlet ends 41 of the switch module 4. The cooling fluid supply channel 21 of the cooling fluid supply module 2 is communicated with the other of the two inlet ends 41 of the switch module 4. On the other hand, the outlet end 42 of the switch module 4 is communicated with the inlets Sin. The switch module 4 is controlled to switch connection of the inlets Sin to the cooling fluid supply channel 21 or the gas pressure source channel 32.

Moreover, the main controller 5 shown in the figure can be used for controlling the operation of the entire electronic device testing apparatus, including the feeding process, the testing process, the dispensing process, the discharging process, the temperature controlling process and the like. The main controller 5 may be an industrial computer including a processor, a memory, storage media and other computer hardware components. The main controller 5 is electrically connected to the cooling fluid supply module 2, the purge gas supply module 3 and the switch module 4 and can be used to control the switch module 4 so that the inlets Sin are connected to the cooling fluid supply channel 21 with the coolant Lc being supplied into the chip socket S by the cooling fluid supply module or connected to the gas pressure source channel 32 with a purge gas being supplied into the chip socket S by the purge gas supply module 3.

Figure 2A:
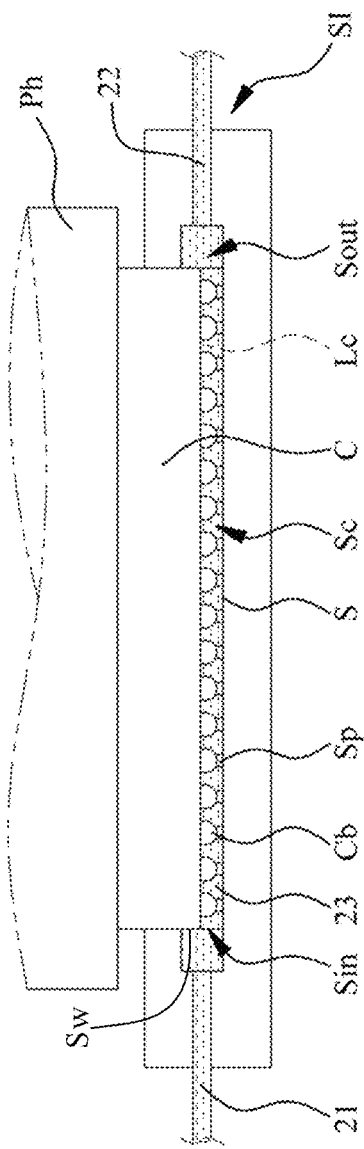
FIG. 2A is a schematic diagram showing the supply of a cooling fluid according to a preferred embodiment of the present invention.
Figure 2B:
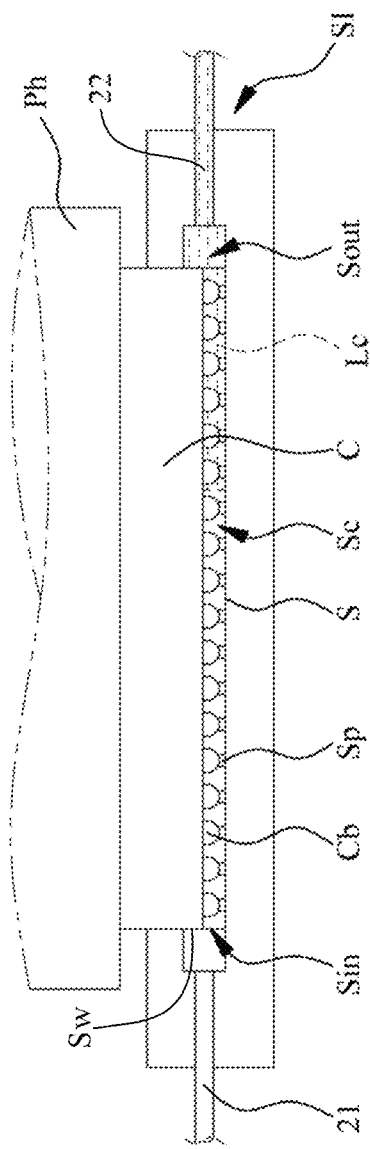
FIG. 2B is a schematic diagram showing the supply of a purge gas according to a preferred embodiment of the present invention.

Reference is made to FIG. 1, FIG. 2A and FIG. 2B. FIG. 2A is a schematic diagram showing the supply of a cooling fluid according to a preferred embodiment of the present invention, and FIG. 2B is a schematic diagram showing the supply of a purge gas according to a preferred embodiment of the present invention. The electronic device testing apparatus of this embodiment further includes a pressing head Ph and a test socket SI. The chip socket S is formed on the upper surface of the test socket SI, and the pressing head Ph is arranged above the test socket SI and can be controlled by the main controller 5 to be selectively moved toward or away from the test socket SI.

The testing and cooling process of the electronic device testing apparatus in this embodiment will be described in detail. First, an electronic device C to be tested is transferred and placed into the chip socket S by the pressing head Ph. At this time, a cooling space Sc is defined by the lower surface of the electronic device, the bottom surface of the chip socket S and the inner peripheral wall Sw of the chip socket S, as shown in FIG. 2A. As shown in the figure, in the cooling space Sc, the solder ball contacts Cb on the lower surface of the electronic device C are brought into electrical contact with the pogo pins Sp on the bottom surface of the chip socket S as the pressing head Ph continues to press the electronic device C, and the inlets Sin and the outlets Sout are communicated with the cooling space Sc.

Next, the main controller 5 activates the pump 23 and controls the switch module 4 so that the inlets Sin are connected to the cooling fluid supply channel 21. After the pump 23 is activated, the coolant Lc is drawn from the coolant tank 24 by the pump 23 and supplied into the cooling space Sc through the cooling fluid supply channel 21 and the inlets Sin. At this time, due to the continuous operation of the pump 23, the coolant Lc is continuously pumped to the cooling space Sc, the entire cooling space Sc is gradually filled with the coolant Lc, and the coolant Lc flows to the outlets Sout and then flows into the cooling fluid discharge channel 22, as shown in FIG. 2A.

The coolant Lc flowing into the cooling fluid discharge channel 22 passes through the filter 26 and the radiator 25 in sequence and finally returns to the coolant tank 24, thereby forming a circulation loop of the coolant Lc. The filter 26 filters out foreign matters such as solder scraps or dust entrained in the coolant Lc. The radiator 25 dissipates the heat of the coolant Lc by means of heat exchange. In other embodiments, for example, during the low temperature test, the radiator 25 can be replaced with a cooler for actively cooling the coolant Lc so as to ensure that the electronic device is kept in a low temperature testing environment.

The electronic device C can then be tested, and during the execution of the test, the pump 23 continues to operate so that the coolant Lc passes through the pogo pins Sp in the chip socket S and the solder ball contacts Cb of the electronic device C and continuously removes the heat generated during the test. As such, the pogo pins Sp, the solder ball contacts Cb and even the electronic device C are cooled.

When the test is completed, the main controller 5 stops the operation of the pump 23, that is, the cooling fluid supply module 2 stops supplying the coolant Lc into the cooling space Sc. Next, the main controller 5 controls the switch module 4 so that the inlets Sin are connected to the gas pressure source channel 32. At this time, since the gas pressure source Sa supplies air at a pressure higher than the atmospheric pressure, the supplied air serving as a purge gas flows into the cooling space Sc and urges the residual coolant Lc out of the cooling space Sc so that the residual coolant Lc flows into the cooling fluid discharge channel 22 through the outlets Sout for recycling when the switch module 4 is switched, as shown in FIG. 2B.

After the purge gas supply module 3 continues to supply the purge gas into the chip socket S for a period of time, the entire chip socket S (including the pogo pins Sp) and the lower surface of the electronic device C (including the solder ball contacts Cb) are cleaned. Finally, the pressing head Ph can pick up the tested electronic device C from the chip socket S and place another electronic device C to be tested into the chip socket S. In this embodiment, the coolant Lc is a non-conductive heat conducting liquid such as 3M™ Novec™ Engineered Fluid which would not cause a short circuit between the pogo pins Sp or a short circuit between the solder ball contacts Cb.

Figure 3A:
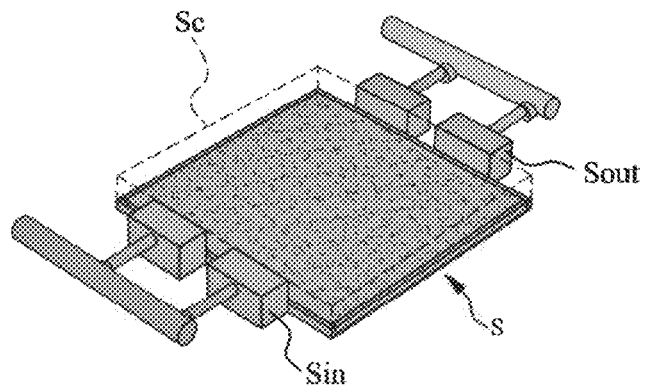
FIG. 3A is a schematic diagram of a first embodiment of a cooling fluid supply module of the present invention.
Figure 3B:
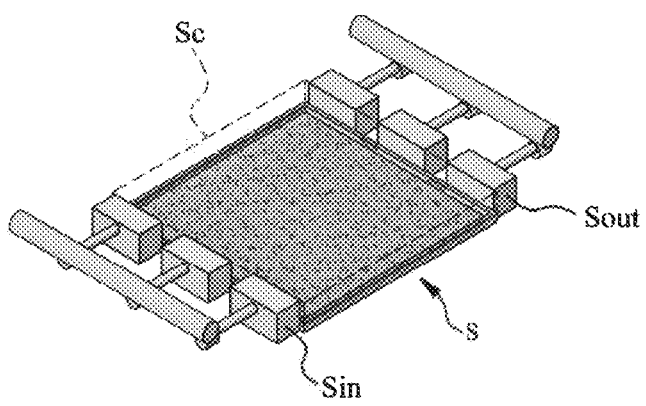
FIG. 3B is a schematic diagram of a second embodiment of the cooling fluid supply module of the present invention.

Reference is made to FIGS. 3A and 3B. FIG. 3A is a schematic diagram of a first embodiment of the cooling fluid supply module of the present invention, and FIG. 3B is a schematic diagram of a second embodiment of the cooling fluid supply module of the present invention. The first and second embodiments of the cooling fluid supply module of the present invention will be described below. The first embodiment adopts two inlets Sin and two outlets Sout, which are respectively disposed on two opposite side walls of the chip socket S. The second embodiment adopts three inlets Sin and three outlets Sout, which are respectively disposed on the two opposite side walls of the chip socket S.

Figure 4A:
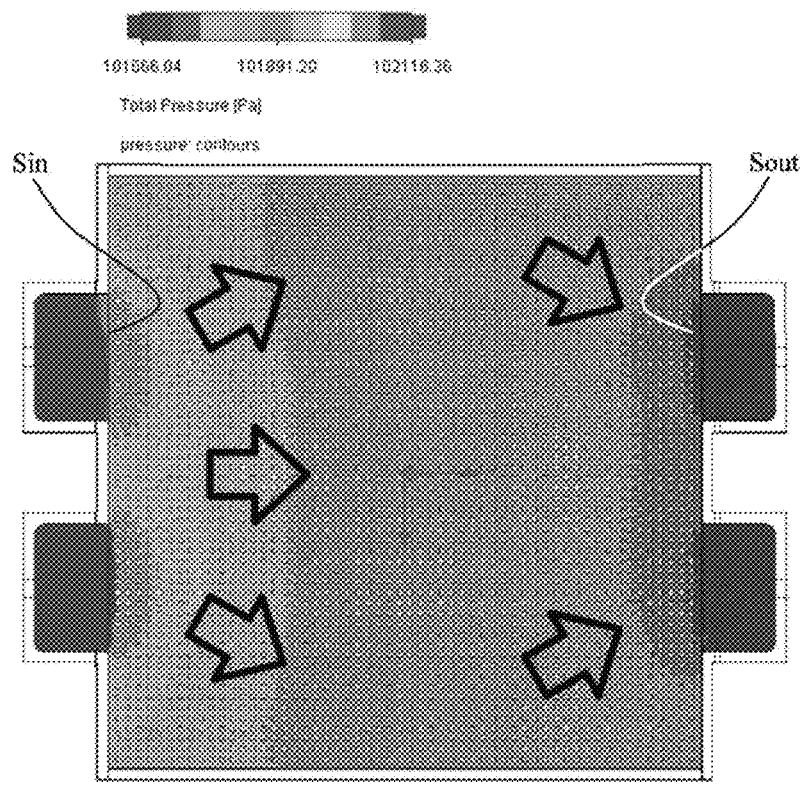
FIG. 4A is an analysis diagram of the fluid pressure of the cooling fluid according the first embodiment of the cooling fluid supply module of the present invention.
Figure 4B:
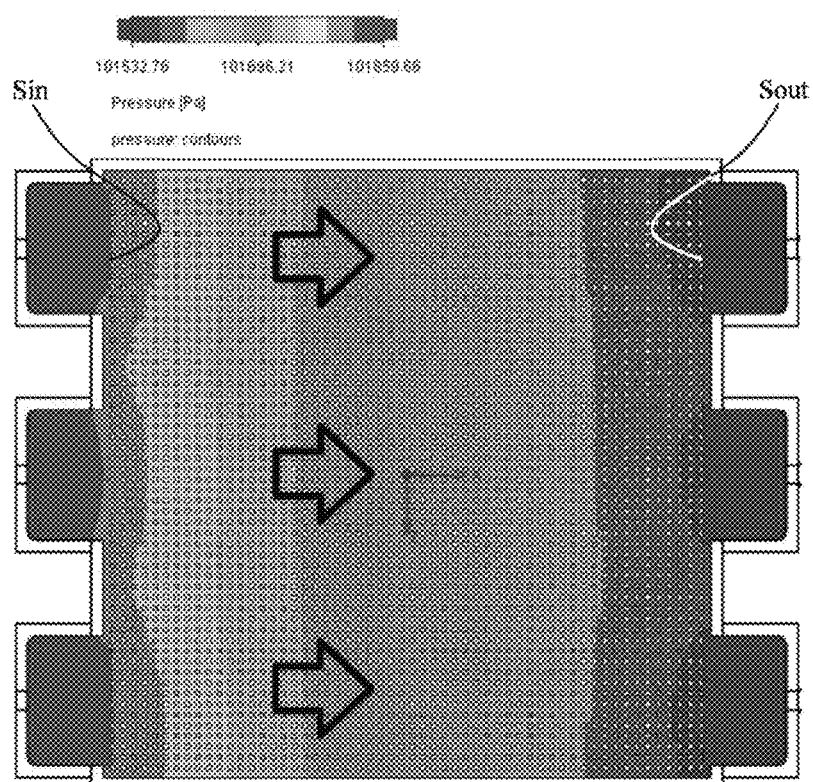
FIG. 4B is an analysis diagram of the fluid pressure of the cooling fluid according the second embodiment of the cooling fluid supply module of the present invention.

Results of computer simulation of the first and second embodiments are shown in FIG. 4A, FIG. 4B, FIG. 5A and FIG. 5B. According to the second embodiment with three inlets and three outlets, the fluid pressure decreases very uniformly in the flow direction, as shown in FIG. 4B. In contrast, according to the first embodiment with two inlets and two outlets, the fluid pressure is higher at the inlets Sin and is lower at the outlets Sout, and the fluid pressure does not decrease uniformly.

Figure 5A:
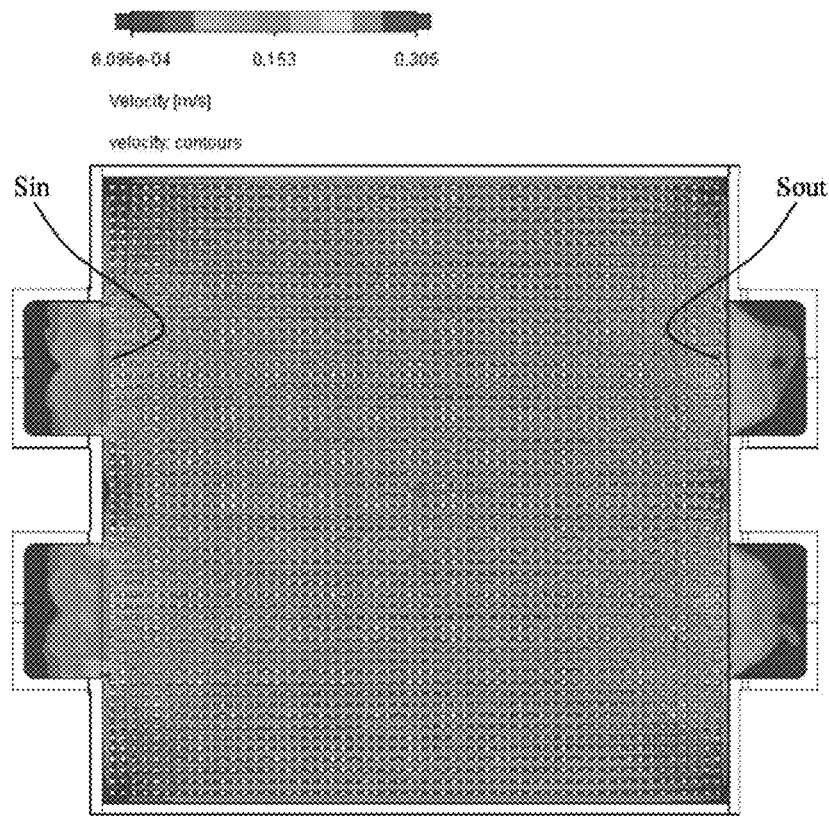
FIG. 5A is an analysis diagram of the velocity of the cooling fluid according the first embodiment of the cooling fluid supply module of the present invention.
Figure 5B:
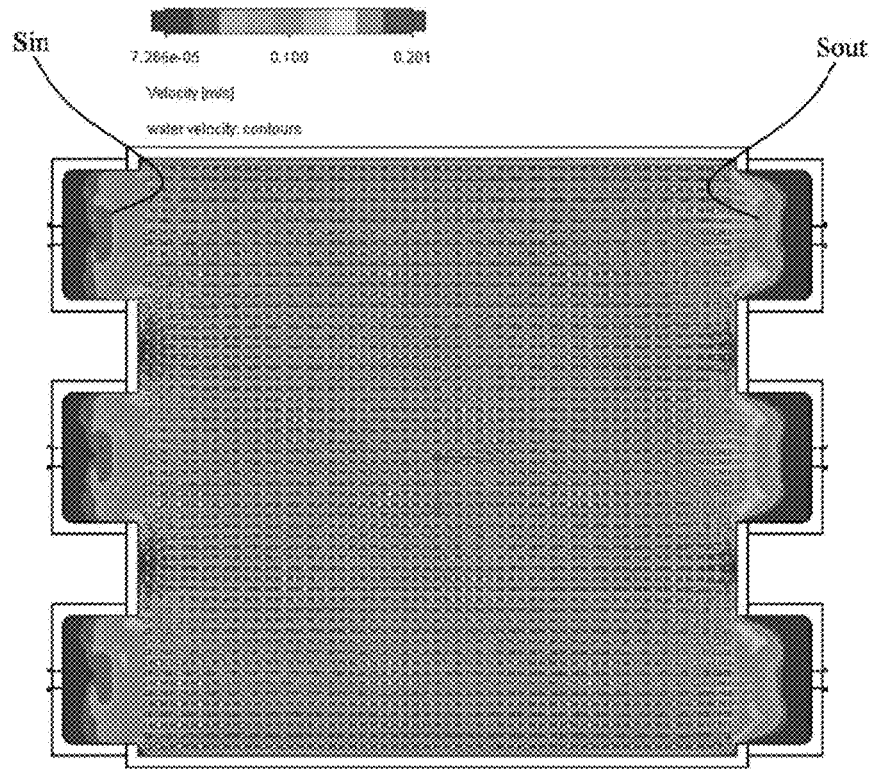
FIG. 5B is an analysis diagram of the fluid velocity of the cooling fluid according the second embodiment of the cooling fluid supply module of the present invention.

As shown in FIG. 5B, in the second embodiment, the fluid velocity is uniform, and the fluid velocity is only slightly lower in the area between two inlets Sin and the area between two outlets Sout. As shown in FIG. 5A, in the first embodiment, the fluid velocity is lower at four corners, and in the area between the inlets and the area between the outlets. This means that the coolant has poor fluidity at the four corners.

Figure 6:
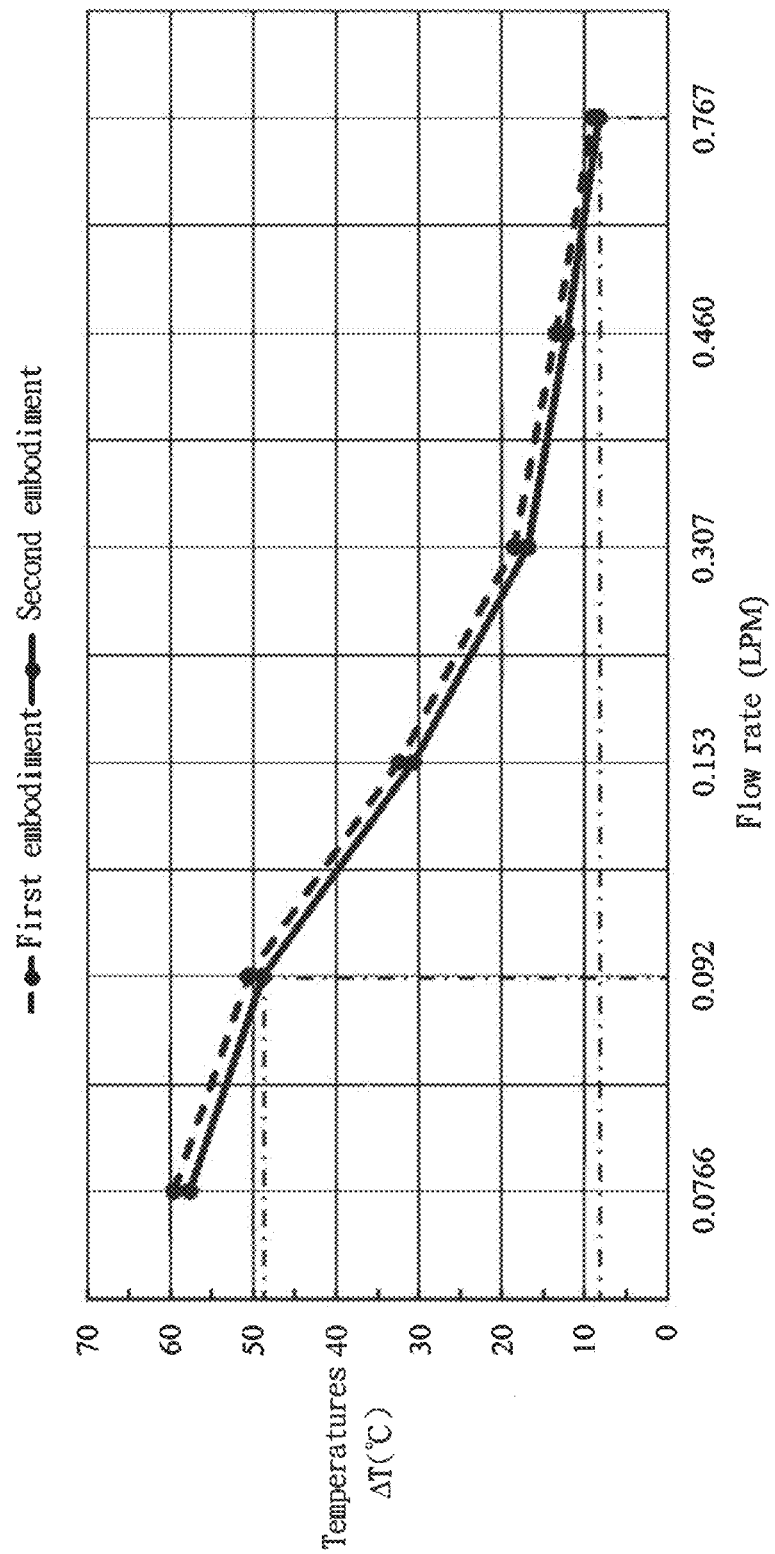
FIG. 6 is a diagram showing the relationship between the flow rate of the cooling fluid and the temperature rise of the pogo pins according to the first and second embodiments of the cooling fluid supply module of the present invention.

Reference is made to FIG. 6, which is a diagram showing the relationship between the flow rate of the coolant and the temperature rise of the pogo pins according to the first and second embodiments of the cooling fluid supply module of the present invention. As shown in FIG. 6, the upper dotted line shows the relationship between the temperature rise and the flow rate in the first embodiment. When the flow rate of the coolant is about 0.092 LPM, the first embodiment can maintain the temperature rise of the pogo pins and the solder ball contacts at about 50 degrees. On the other hand, the lower solid line shows the relationship between the temperature rise and the flow rate in the second embodiment. It can be clearly seen from the figure that the second embodiment with three inlets and three outlets has a better cooling effect.

Figure 7:
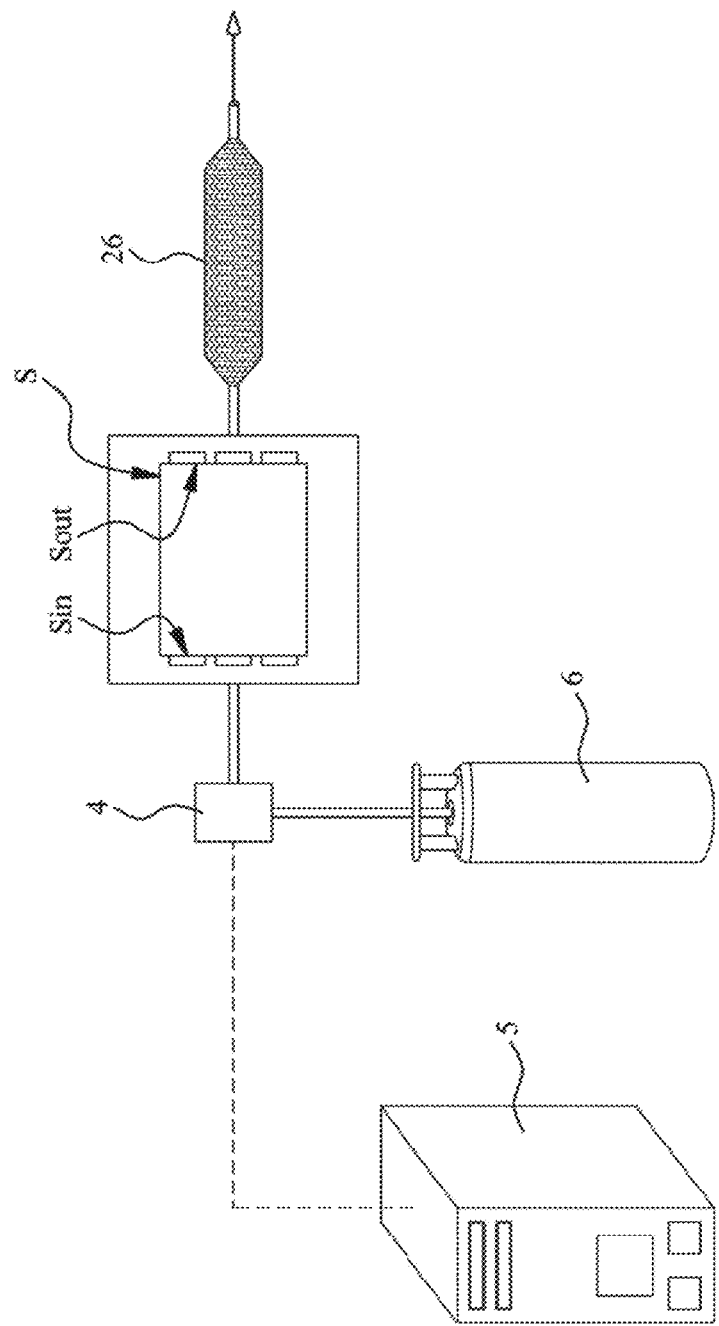
FIG. 7 is a schematic diagram of a pogo pin cooling system of the present invention employing a gas cooling method.

Reference is made to FIG. 7, which is a schematic diagram of a pogo pin cooling system of the present invention employing a gas cooling method. This embodiment utilizes a cooling gas as the cooling fluid, which can be air, nitrogen, argon or helium. As shown in the figure, the system mainly comprises a cooling gas supply module 6, a switch module 4, a filter 26 and a main controller 5. In this embodiment, the cooling gas supply module 6 is a liquid nitrogen tank, which is connected to the chip slot S through the switch module 4. In other embodiments of the invention, if low temperature testing or cooling is not required, the cooling gas supply module 6 can also be the air supply system in the factory, where the high pressure air is directly used as the cooling fluid. The main controller 5 is electrically connected to the switching module 4, enabling the main controller 5 to control the switching module 4, which in turn controls the supply of the cooling gas to the chip socket S via the inlets Sin. Additionally, the cooling gas flows out of the chip socket S via the outlets Sout and can be discharged directly into the atmosphere after passing through the filter 26.

As a result, the pogo pin cooling system of this invention can use both coolant and cooling gas as the cooling fluid. When using cooling gas, it is not necessary to take the recovery mechanism of the gas into consideration, as the gas would not contaminate electronic devices or cause a short circuit, and it also has a cleaning effect.

The preferred embodiments of the present invention are illustrative only, and the claimed inventions are not limited to the details disclosed in the drawings and the specification. Accordingly, it is intended that it have the full scope permitted by the language of the following claims.

The invention claimed is:

1. An electronic device testing apparatus comprising a pogo pin cooling system, a pressing head, a test socket and a main controller, the pogo pin cooling system for cooling a plurality of pogo pins in a chip socket, the chip socket comprising an inner peripheral wall having at least one inlet and at least one outlet disposed thereon, the pogo pin cooling system comprising:
   at least one cooling fluid supply channel, at least one cooling fluid discharge channel and a cooling fluid supply module, the at least one cooling fluid supply channel being in fluid communication with the at least one inlet, and the at least one cooling fluid discharge channel being in fluid communication with the at least one outlet, the cooling fluid supply module being in fluid communication with the at least one cooling fluid supply channel, wherein the cooling fluid supply module is a cooling gas supply module that supplies a cooling gas as the cooling fluid;

wherein when an electronic device is accommodated in the chip socket, the cooling fluid supply module supplies the cooling gas into a cooling space through the at least one cooling fluid supply channel and the at least one inlet, such that the cooling gas passes through the plurality of pogo pins and then flows into the at least one cooling fluid discharge channel through the at least one outlet;

wherein the cooling space is defined by a lower surface of the electronic device, a bottom surface of the chip socket and the inner peripheral wall of the chip socket;

wherein the main controller is electrically connected to the pressing head, the test socket and the cooling fluid supply module, wherein the chip socket is formed on an upper surface of the test socket, the pressing head is arranged above the test socket and is controlled by the main controller to be selectively moved toward or away from the test socket; when the electronic device is accommodated in the chip socket, the controller controls the pressing head to press the electronic device and controls the cooling fluid supply module to supply the cooling fluid into the chip socket.

\* \* \* \* \*